(12) United States Patent
Lien et al.

(10) Patent No.: US 11,189,337 B1
(45) Date of Patent: Nov. 30, 2021

(54) MULTI-STAGE VOLTAGE CONTROL FOR PEAK AND AVERAGE CURRENT REDUCTION OF OPEN BLOCKS

(71) Applicant: WESTERN DIGITAL TECHNOLOGIES, INC., San Jose, CA (US)

(72) Inventors: Yu-Chung Lien, San Jose, CA (US); Huai-Yuan Tseng, San Ramon, CA (US); Deepanshu Dutta, Fremont, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/888,571

(22) Filed: May 29, 2020

(51) Int. Cl.
*G11C 16/04* (2006.01)
*G11C 11/408* (2006.01)
*G11C 5/02* (2006.01)
*G11C 11/409* (2006.01)
*G11C 11/4074* (2006.01)

(52) U.S. Cl.
CPC .......... *G11C 11/4085* (2013.01); *G11C 5/025* (2013.01); *G11C 11/409* (2013.01); *G11C 11/4074* (2013.01); *G11C 11/4087* (2013.01)

(58) Field of Classification Search
CPC . G11C 11/4085; G11C 5/025; G11C 11/4074; G11C 11/4087; G11C 11/409
USPC .................................................... 365/185.17
See application file for complete search history.

(56) References Cited

U.S. PATENT DOCUMENTS

| | | | |
|---|---|---|---|
| 9,329,986 B2 | 5/2016 | Li et al. | |
| 9,361,951 B2 | 6/2016 | Sommer et al. | |
| 9,536,617 B2 | 1/2017 | Al-Shamma et al. | |
| 9,947,401 B1 | 4/2018 | Navon et al. | |
| 10,049,754 B1* | 8/2018 | Jung | G06F 1/24 |
| 2013/0051148 A1 | 2/2013 | Lee et al. | |
| 2015/0170751 A1 | 6/2015 | Yanamanamanda et al. | |
| 2018/0059971 A1 | 3/2018 | Jung et al. | |
| 2019/0304549 A1 | 10/2019 | Yang et al. | |
| 2019/0333588 A1 | 10/2019 | Yang et al. | |
| 2020/0050515 A1* | 2/2020 | Gim | G06F 11/1048 |

OTHER PUBLICATIONS

International Search Report and Written Opinion issued for Int'l Appl. No. PCT/US2021/020024, Int'l Filing Date Feb. 26, 2021, dated Jun. 17, 2021.

* cited by examiner

*Primary Examiner* — Huan Hoang
(74) *Attorney, Agent, or Firm* — Arent Fox LLP

(57) ABSTRACT

Aspects of a storage device including a memory and a controller are provided which allow for reduction of current in open blocks during read operations using multi-stage read voltage control. The controller determines whether a block is open or closed. If the block is closed, the controller causes a read voltage to be applied to one of the block's word lines. If the block is open, the controller causes a read voltage to be applied to another of the block's word lines in a number of stages. The controller further causes a read voltage to be applied to another word line of the open block in a different number of stages. Thus, read voltages for open blocks may ramp in multiple stages in contrast to read voltages for closed blocks, as well as ramp in different numbers of stages for different word lines in open blocks.

20 Claims, 13 Drawing Sheets

MULTI-STAGE VOLTAGE CONTROL FOR PEAK AND AVERAGE CURRENT REDUCTION OF OPEN BLOCKS

BACKGROUND

Field

This disclosure is generally related to electronic devices and more particularly to storage devices.

Background

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

When reading data from cells of the flash memory, the flash storage device may identify the physical address of a block associated with a logical address, and may then apply a read voltage to a word line of the block at the identified physical address to sense the data from the cells coupled to that word line. Applying the read voltage to the word line may result in a current (Icc) which flows along a bit line coupled the cells and whose average and peak values may impact the life of the flash memory. For example, a small average Icc may result in more sustainable flash memories, and a small peak Icc may maintain voltages at reasonable levels in order to allow the flash storage device to function properly. As flash storage devices generally provide a fixed amount of power, a large peak or average Icc may cause voltages to drop to an extent affecting the device's functionality.

SUMMARY

One aspect of a storage device is disclosed herein. The storage device includes a memory and a controller. The memory comprises a block including a plurality of word lines. The controller is configured to determine whether the block is open or closed, to cause a read voltage to be applied to a first one of the word lines of the block in response to determining the block is closed, and to cause a read voltage to be applied to a second one of the word lines of the block in a number of stages in response to determining the block is open.

Another aspect of a storage device is disclosed herein. The storage device includes a memory and a controller. The memory comprises a block including a plurality of word lines. The controller is configured to determine whether the block is open, to cause a read voltage to be applied to a first one of the word lines of the block in a first number of stages in response to determining the block is open, and to cause a read voltage to be applied to a second one of the word lines of the block in a second number of stages different than the first number of stages.

A further aspect of a storage device is disclosed herein. The storage device includes a memory and a controller. The memory comprises a first block and a second block each including a plurality of word lines. The controller is configured to determine whether the first block is open or closed, and to cause a read voltage to be applied to a first one of the word lines of the first block in response to determining the first block is closed. The controller is further configured to determine whether the second block is open or closed, to cause a read voltage to be applied to a second one of the word lines of the second block in a first number of stages in response to determining the second block is open, and to cause a read voltage to be applied to a third one of the word lines of the second block in a second number of stages different than the first number of stages.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
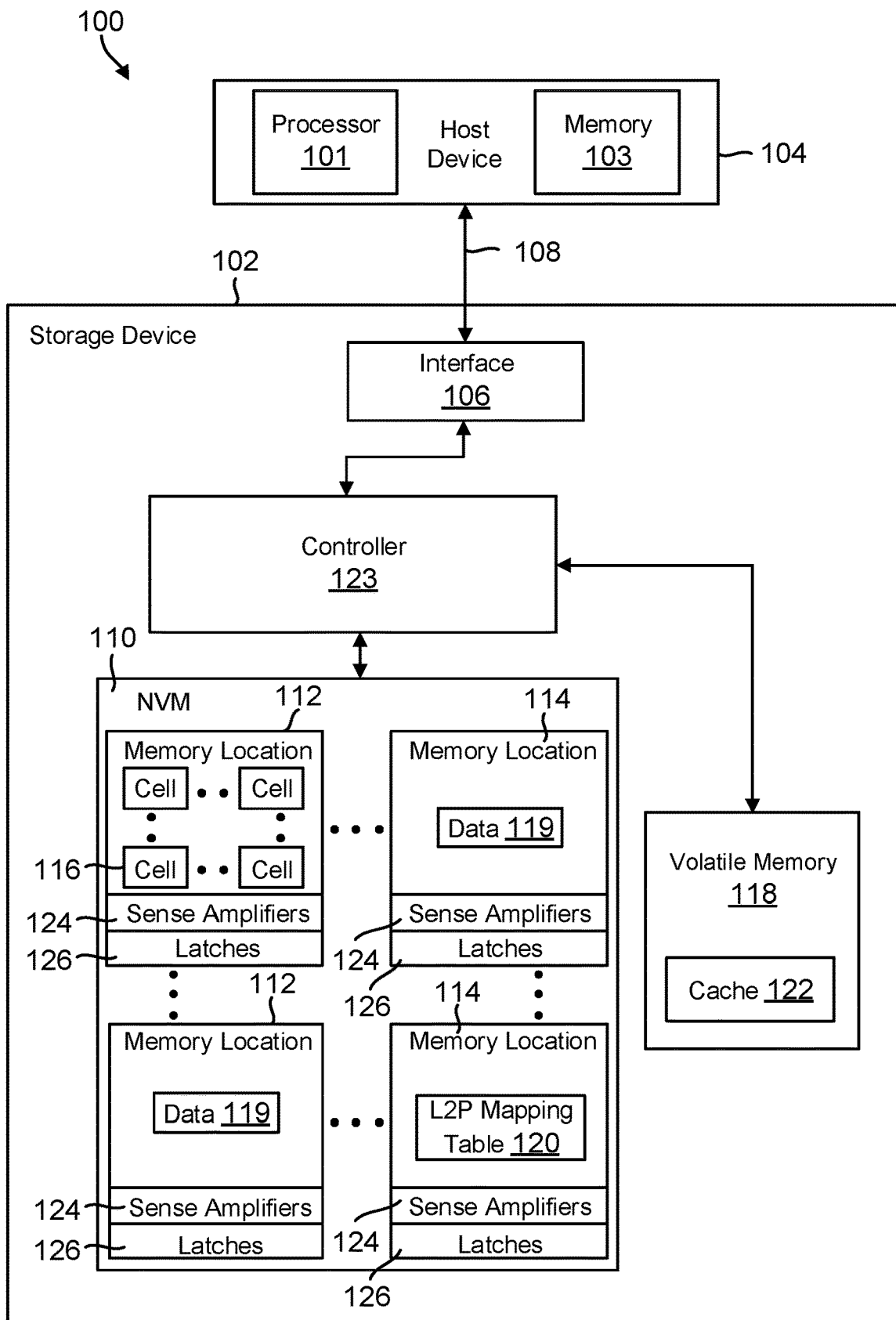
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

When a controller of the storage device writes data into memory, the controller generally programs blocks of several dies. For example, the controller may program, in parallel, cells coupled to a few word lines in blocks of different planes in several dies. As a result, when the controller subsequently reads data from blocks in memory, many of these blocks may be open blocks (e.g. partially programmed) at the time the read is performed. However, reading data from open blocks may result in higher peak and average current (e.g. during a pre-read) than reading data from fully programmed blocks (i.e. closed blocks), particularly when blocks are being read in parallel from more than three planes. Such higher currents may result in voltage drops to maintain the fixed power provided in the storage device, impacting the read performance of the device.

During a pre-read, the storage device may apply a read voltage to word lines coupled to cells of a block at a typically fast ramp rate (e.g. using a charge pump) until the voltage reaches a target voltage (Vread). This read voltage may be applied to word lines of unselected cells of NAND memory (e.g. as a read pass voltage) to allow selected cells in the memory to be sensed on the bit line following the pre-read. However, such rapid increase of the read voltage over time during the pre-read may result in high current along the bit line coupled to the cells. While this current may be manageable in closed blocks, stronger channel inversion in open blocks (e.g. due to the presence of electrons in the channels of un-programmed cells) may result in significantly higher peak and average current than in closed blocks. Similarly, open blocks including less programmed cells (e.g. blocks which have been partially programmed from word line 0 to word line 24 or another small number) may result in higher peak and average current than open blocks including more programmed cells (e.g. blocks which have been partially programmed from word line 0 up to word line 70 or another large number).

To reduce the peak and average current resulting from pre-reads of open blocks, the storage device described in the present disclosure provides ramp rate and multi-stage voltage control when applying read voltages to the cells of an open block. A controller of the storage device may determine whether a block to be read is a fully programmed (i.e. closed block) or partially programmed (i.e. open block). If the block is fully programmed (the block is closed), the controller may cause the read voltage to be applied to the word lines of the cells at the fast ramp rate described above. Otherwise, if the block is not fully programmed (the block is open), the controller may cause the read voltage to be applied during the pre-read at a reduced ramp rate, or alternatively or additionally in multiple voltage stages, to reduce the change in voltage over time and thus decrease the significantly higher peak and average current for open blocks. The controller may also reduce the voltage ramp rate even further, or alternatively or additionally cause the voltage to be applied in a larger number of stages, for open blocks with less programmed cells than for open blocks with more programmed cells. The controller may additionally cause the application of different ramp rates, different stages, and/or different target voltages for programmed and un-programmed cells of an open block. In this way, a balance of power consumption and read performance of the storage device may be achieved.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

As shown in the exemplary embodiment of FIG. 1, the storage device 102 includes non-volatile memory (NVM) 110 for non-volatilely storing data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the illustrated exemplary embodiment of FIG. 1, each memory location 112 may be a block 114 including multiple cells 116. The cells 116 may be single-level cells, multi-level cells, triple-level cells, quad-level cells, and/or penta-level cells, for example. Other examples of memory locations 112 are possible; for instance, each memory location may be a die containing multiple blocks. Moreover, each memory location may include one or more blocks in a 3-D NAND array. Moreover, the illustrated memory locations 112 may be logical blocks which are mapped to one or more physical blocks.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
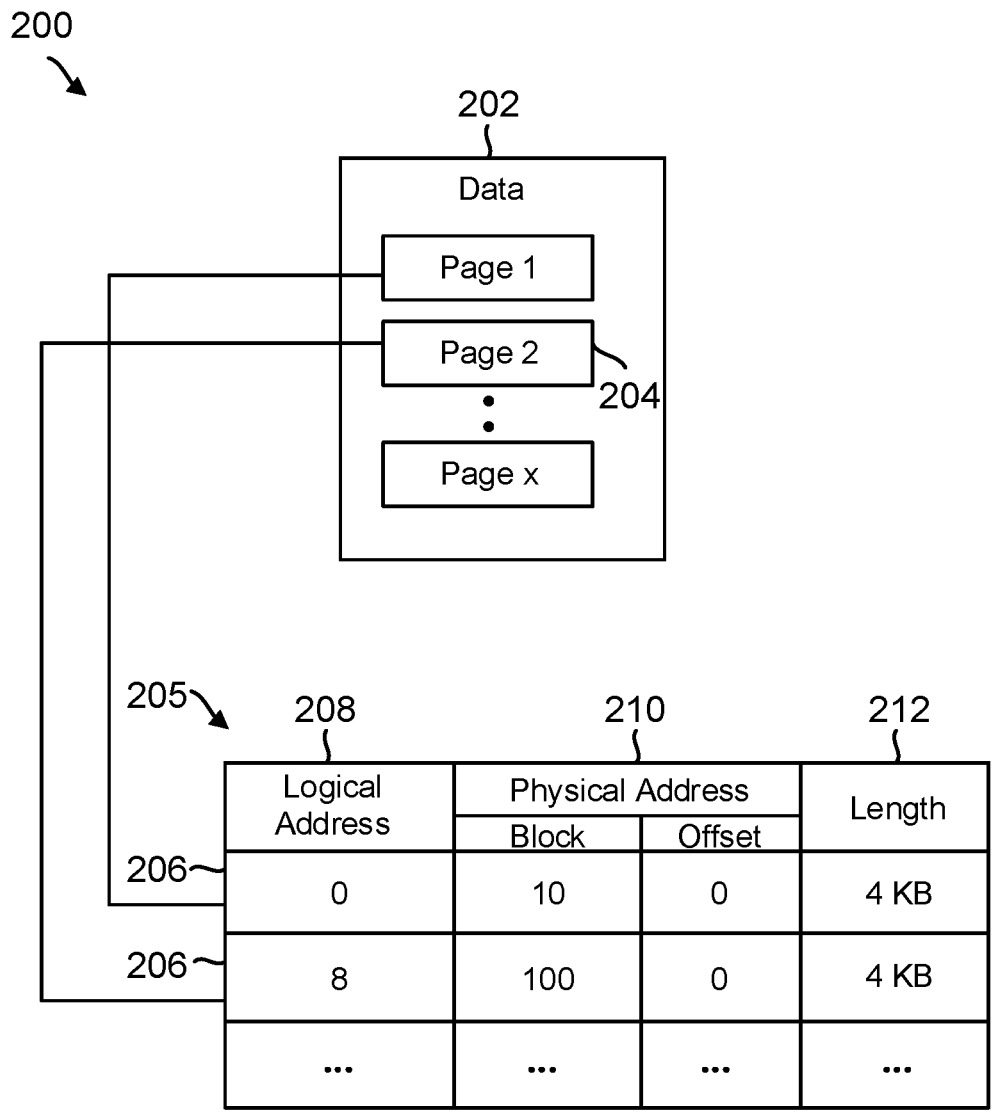
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
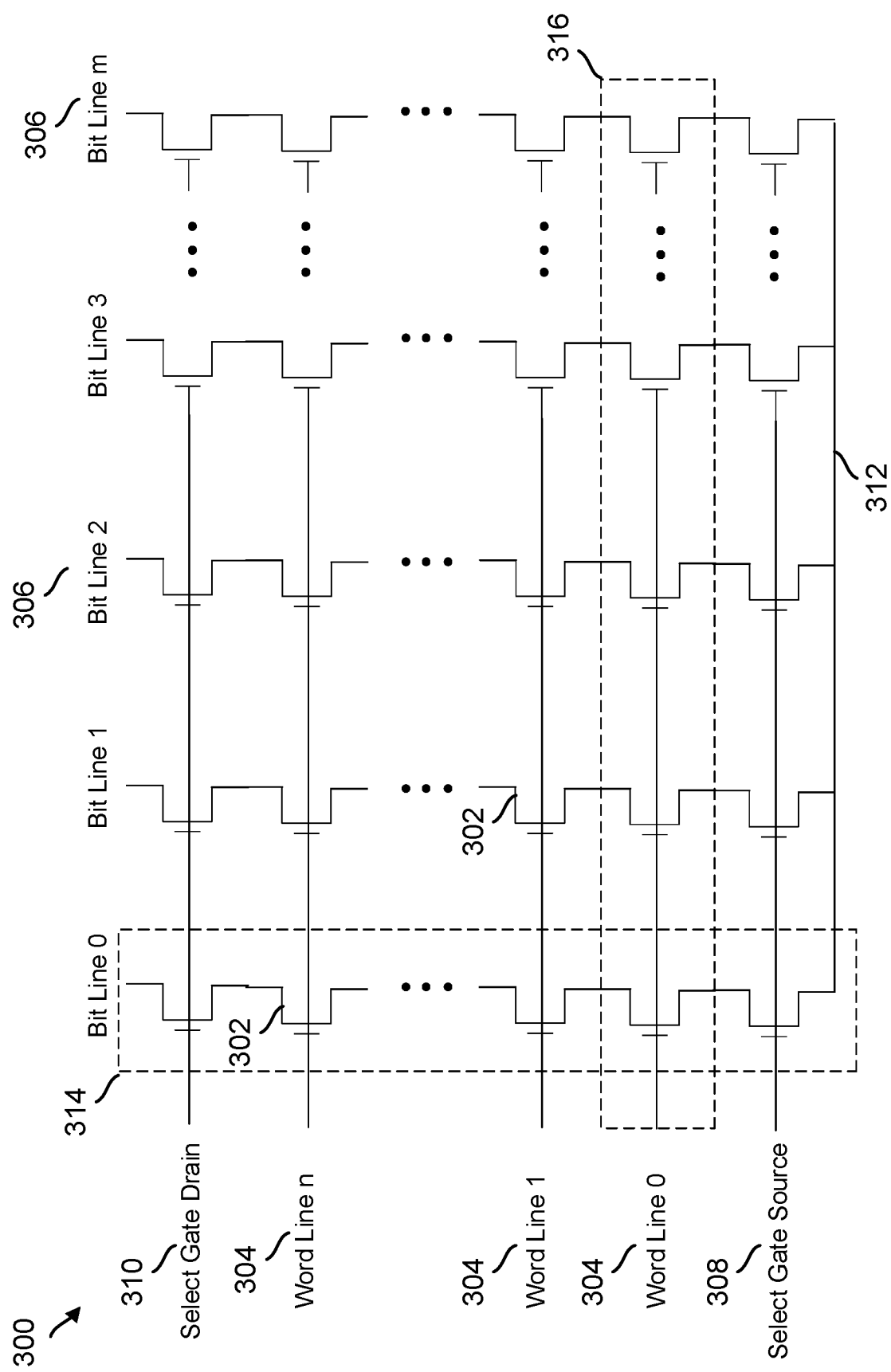
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
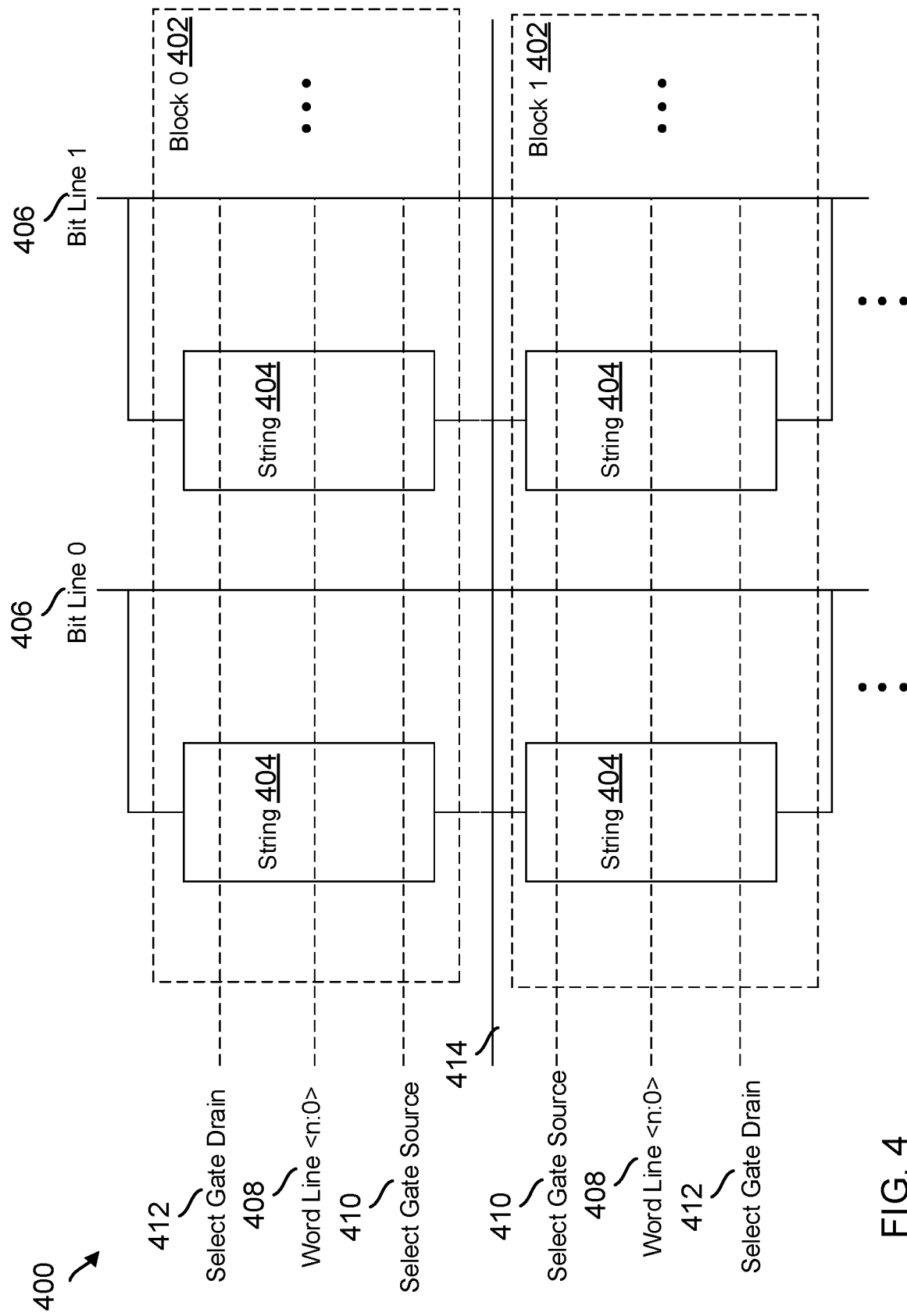
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by sending a command to apply the program voltage to the cell 302 on the word line 304, 408 until the cell reaches the threshold voltage, and during an erase operation, the controller may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller may similarly send commands to apply read or program voltages to the word lines to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. When programming TLCs, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 5:
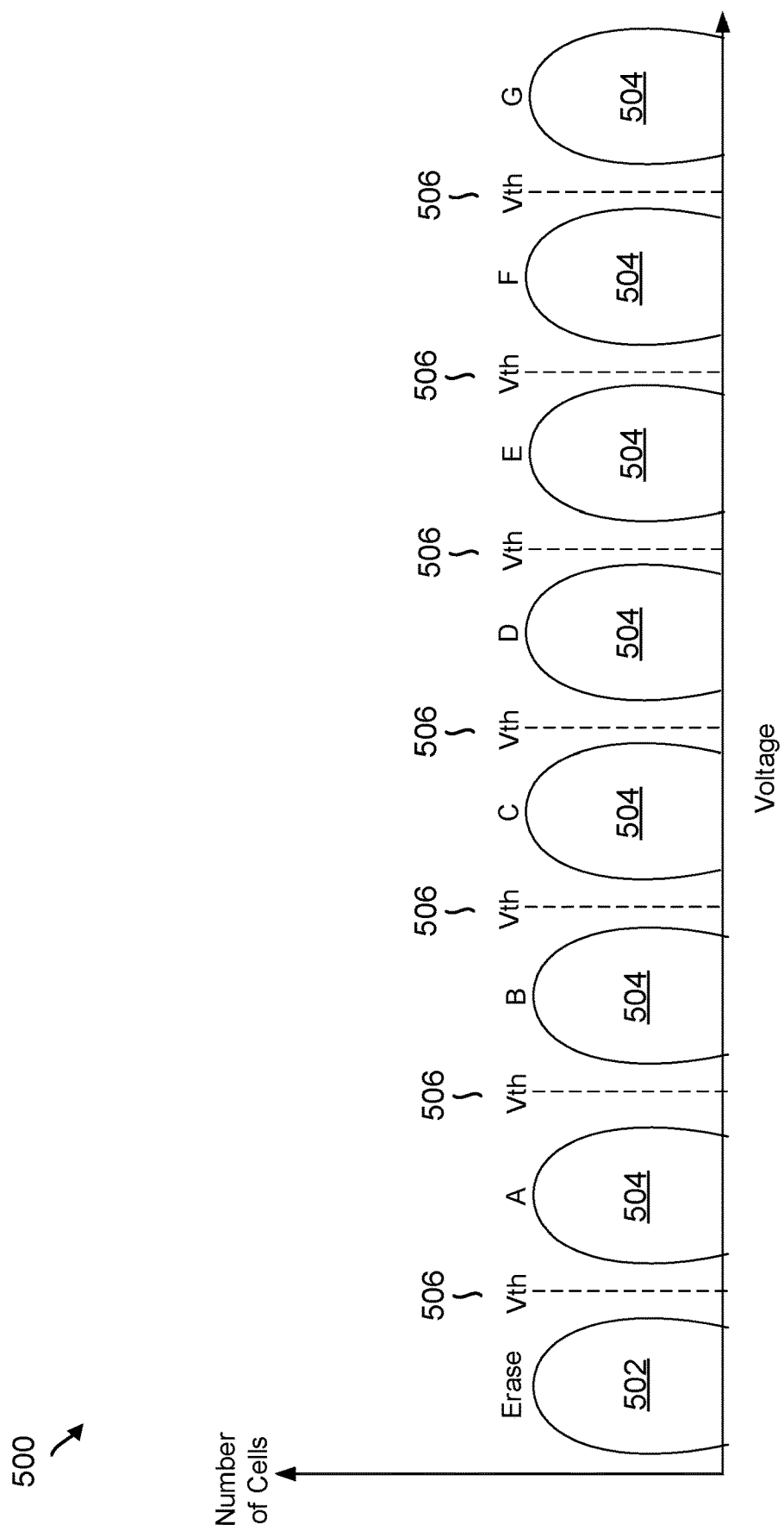
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 corresponding to logic '111' and multiple program states 504 (e.g. A-G) corresponding to other logic values '000-110'. The program states 504 may be separated by different threshold voltages 506. Initially, the cells 116, 302 may be in the erase state 502, e.g. after the controller 123 erases a block 114, 402 including the cells. When the controller 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states.

Figure 6:
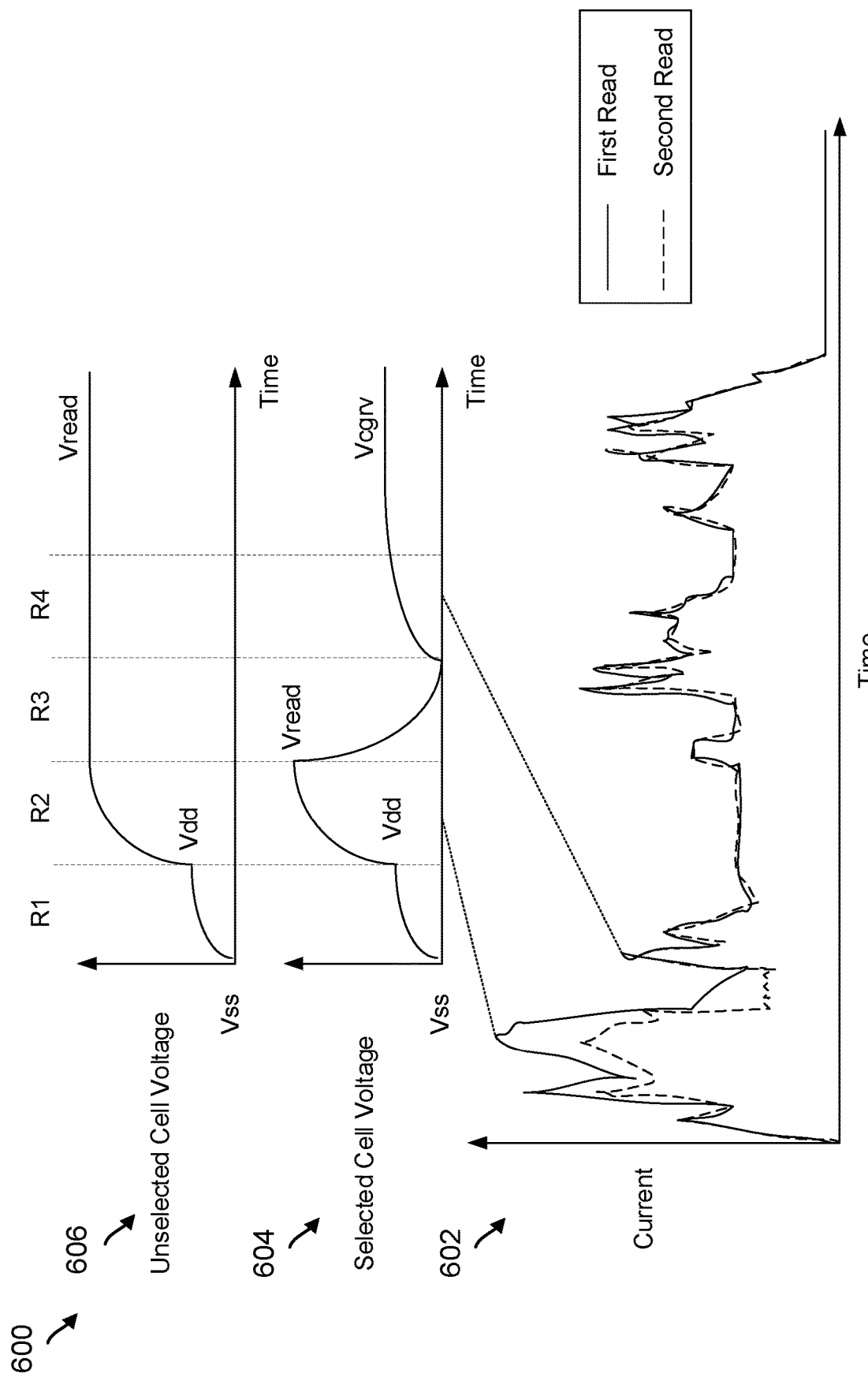
FIG. 6 are graphical diagrams illustrating an example of a current and voltage relationship over time for reads performed on cells.

FIG. 6 illustrates various charts 600 illustrating an example of a current and voltage relationship over time for reads performed on cells, including a diagram 602 of changes in currents over time for different reads, a diagram 604 of changes in read voltage applied over time to a word line coupled to selected cells for a first read, and a diagram 606 of changes in read voltage applied over time to word lines coupled to unselected cells during the first read. When the controller 123 first reads cells 302 of a selected word line 304, 408 in a block 402, a pre-read operation is initially performed during which a read voltage is applied to the word lines 304, 408 coupled to the selected cells to be read and to the unselected cells to be passed through (i.e. for activating the other cells of strings 404 to enable current to flow along the bit lines 406). At the beginning of the first pre-read operation, the read voltage applied to the cells are stressed to Vss (e.g. ground), and during time R1 (corresponding to an R clock), the read voltage is charged to Vdd. Subsequently during time R2, the read voltage applied to the cells is ramped up to a higher voltage Vread, which allows current to pass through the unselected cells on the bit line 406. The voltage may be ramped up using a charge pump, for example. Afterwards, during time R3, the read voltage applied to the selected cells is discharged, completing the pre-read operation. Next, during time R4, the read voltage applied to the selected cells is charged to Vcgrv (a high voltage less than Vread), which the controller uses to sense the data read from the selected cells along the bit line 406 using the sense amplifiers 124 into the data latches 126.

However, as illustrated in diagram 602, the peak current may be highest during the first pre-read at time R2 when the read voltage applied to the word lines is rapidly ramped up to the high voltage Vread. In contrast, the peak current may be lower in subsequent pre-reads. For example, during a second read, a residue voltage may remain on the word lines from the previous read, allowing the read voltage to remain above Vss during the pre-read and resulting in less voltage ramping to charge back to Vread. However, if the read voltage is stressed back to Vss before a subsequent pre-read, the peak current may again increase to a highest point during that pre-read. The peak current may especially be highest at this point (e.g. at time R2) when the read voltage is being applied simultaneously to word lines over multiple planes.

Figure 7:
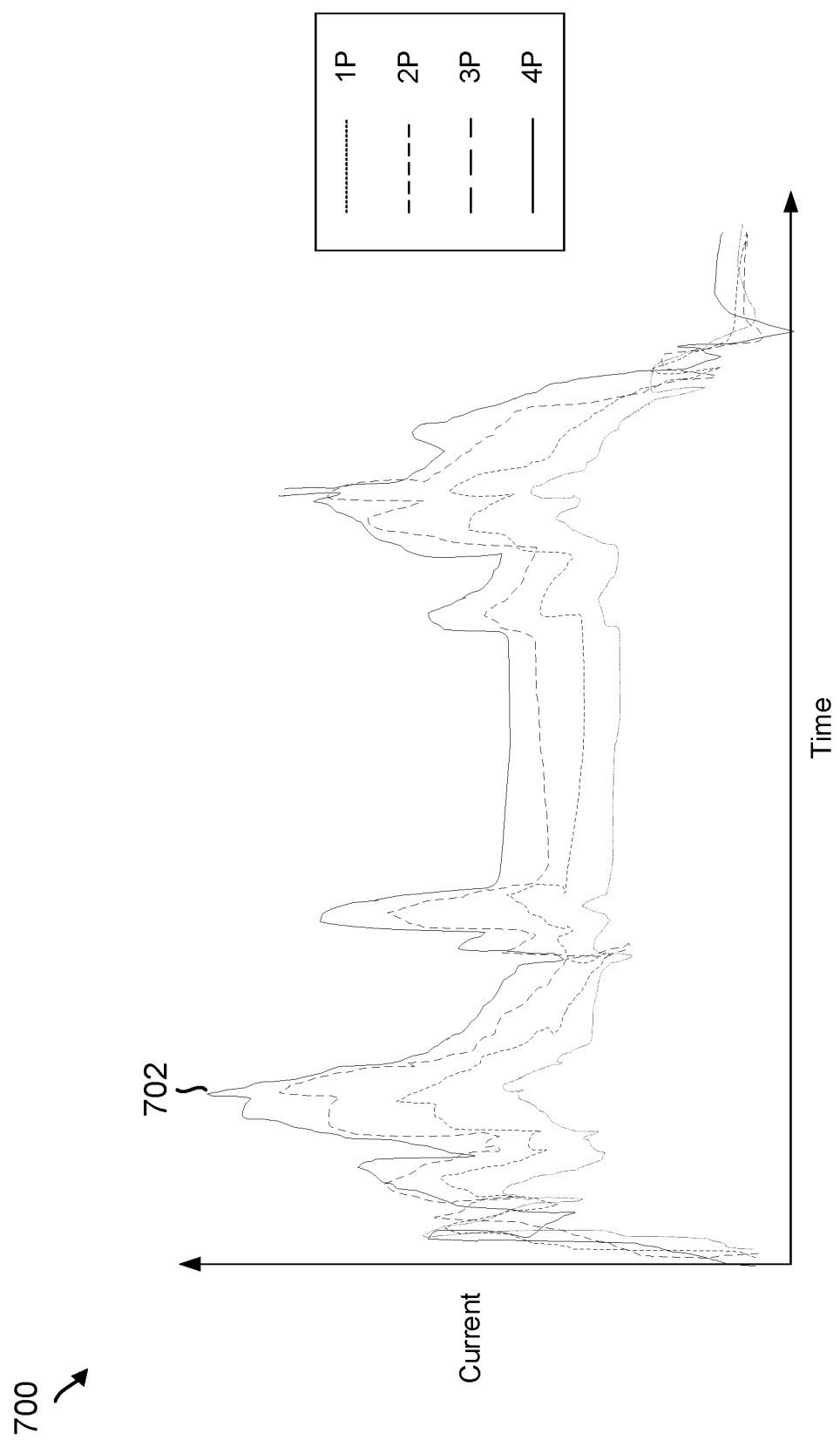
FIG. 7 is a graphical diagram illustrating an example of current over time for reads performed on cells in different numbers of planes.

FIG. 7 illustrates an example diagram 700 illustrating an example of changes in current over time for reads performed on cells in different numbers of planes. Diagram 700 illustrates examples of how the current may change during a read operation (similar to diagram 602) when a read voltage is applied to read a LP, although the changes in current may be similar during the pre-read operation (e.g. the first few current peaks) when reading the MP and the UP. When the controller 123 simultaneously reads cells 302 of a selected word line 304, 408 in multiple blocks 402 spanning multiple planes of a die, the peak current 702 (i.e. the third peak) may increase with the number of planes. For example, assuming a lack of an external power supply (i.e. without Vpp), the peak current 702 may have a peak Icc of 56.5 mA for a single plane LP read, 80.1 mA for a two plane LP read, 104.9 mA for a three plane LP read, and 125.2 mA for a four plane LP read. The peak current may have other values in other examples, although increasing with the number of planes.

Figure 8:
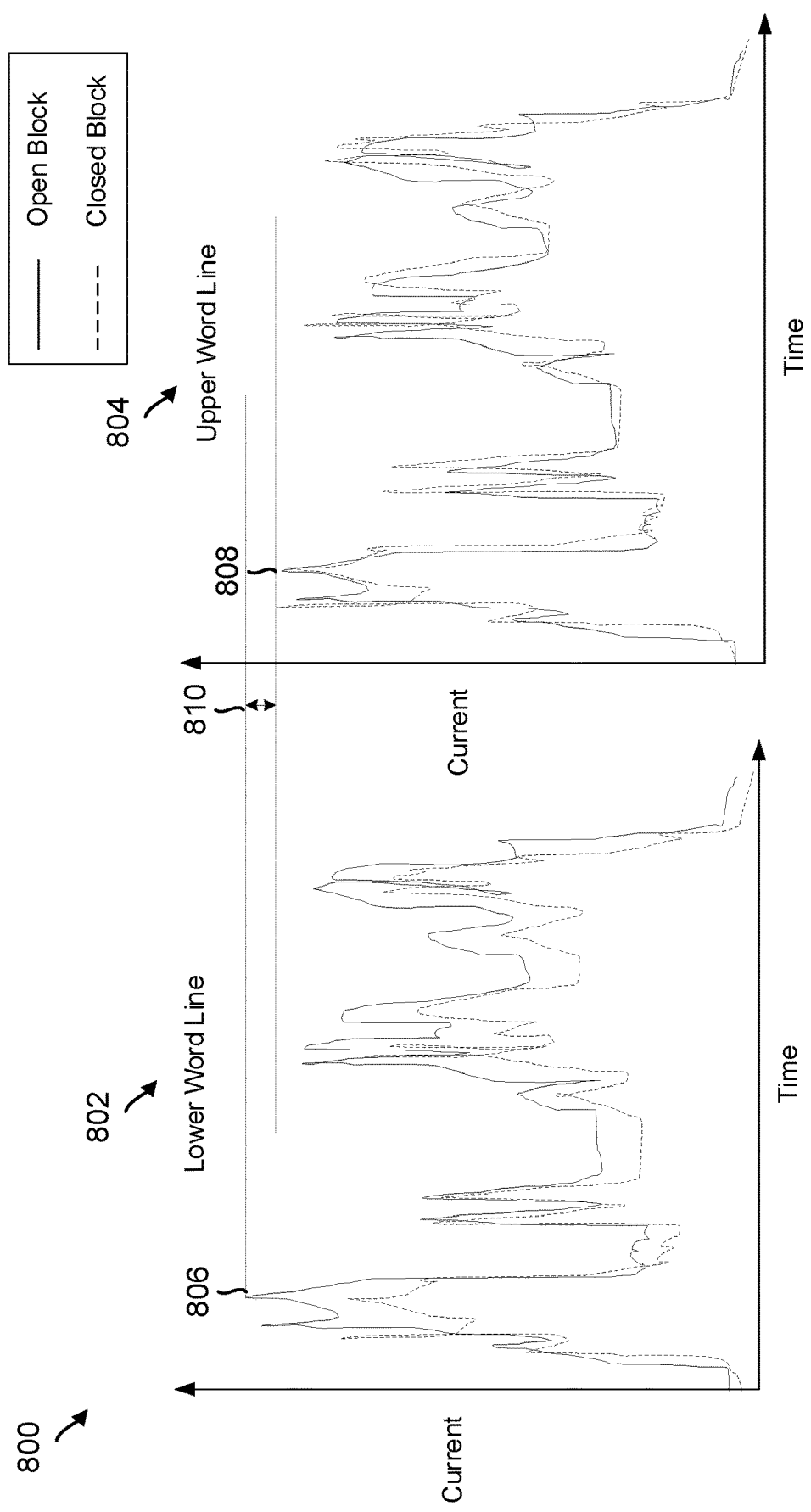
FIG. 8 are graphical diagrams illustrating an example of a relationship between currents over time for reads performed on cells coupled to different word lines in open and closed blocks.

Moreover, the peak current and average current during the pre-read (e.g. at time R2) may be even higher for open blocks, which are common in flash memory. Additionally, the peak current and average current may differ between word lines of an open block. FIG. 8 illustrate charts 800 showing examples of currents changing over time for reads performed on cells in open and closed blocks coupled to different word lines, including a diagram 802 depicting an example for a first word line and a diagram 804 depicting an example for a second word line. The first word line may be a word line with a smaller word line address or identifier (for example, word line 24), and the second word line may be a word line with a larger word line address or identifier (e.g. word line 74). The first word line may also be positioned below the second word line in a NAND memory array held in a vertical orientation (e.g. word line 24 is below word line 70 in the memory array 300 of FIG. 3). In normal order programming (NOP), the controller 123 may program the first word line before the second word line (e.g. in ascending order of address and/or position, or from the source side to the drain side of the bit line). In such implementation, the first word line may be considered a lower word line (e.g. below the second word line in terms of address and/or position), while the second word line may be considered an upper word line (e.g. above the first word line in terms of address and/or position). However, in reverse order programming (ROP), the controller 123 may program the second word line before the first word line (e.g. in descending order of address and/or position, or from the drain side to the source side of the bit line). In this implementation, the second word line may be considered the lower word line, while the first word line may be considered the upper word line. The following description refers to lower and upper word lines in the context of NOP, although the principles described throughout this disclosure may similarly apply for ROP.

Diagrams 802 and 804 illustrate examples of how the current may change during a read operation (similar to diagrams 602 and 700) when a read voltage is applied to different word lines in different blocks (i.e. open and closed) to read a LP spanning two planes. However, the changes in current over time may be similar during the pre-read operation (e.g. the first few current peaks) when reading the MP and the UP. When the controller 123 simultaneously reads cells 302 of a selected word line 304, 408 in multiple blocks 402 (i.e. open and closed) spanning multiple planes of a die, the peak current 806, 808 (i.e. the third peak) may be higher for open blocks than for closed blocks. Moreover, the peak current 806, 808 in open blocks may be higher for lower word lines than for upper word lines, as illustrated by delta 810 in FIG. 8. For example, the peak current 806 may have a peak Icc of 63.8 mA for a two plane LP read of a lower word line (e.g. WL 24) in an open block, while having a peak Icc of 57.6 mA for a two plane LP read of the lower word line in a closed block. Moreover, the peak current 808 may have a peak Icc of 59.4 mA for a two plane LP read of an upper word line (e.g. WL 70), while having a peak Icc of 57.8 mA for a two plane LP read of the upper word line in a closed block. The peak current may have other values in other examples, although open blocks may have higher peak Iccs than closed blocks, and lower word lines in open blocks may have higher peak Iccs than upper word lines in open blocks.

Figure 9:
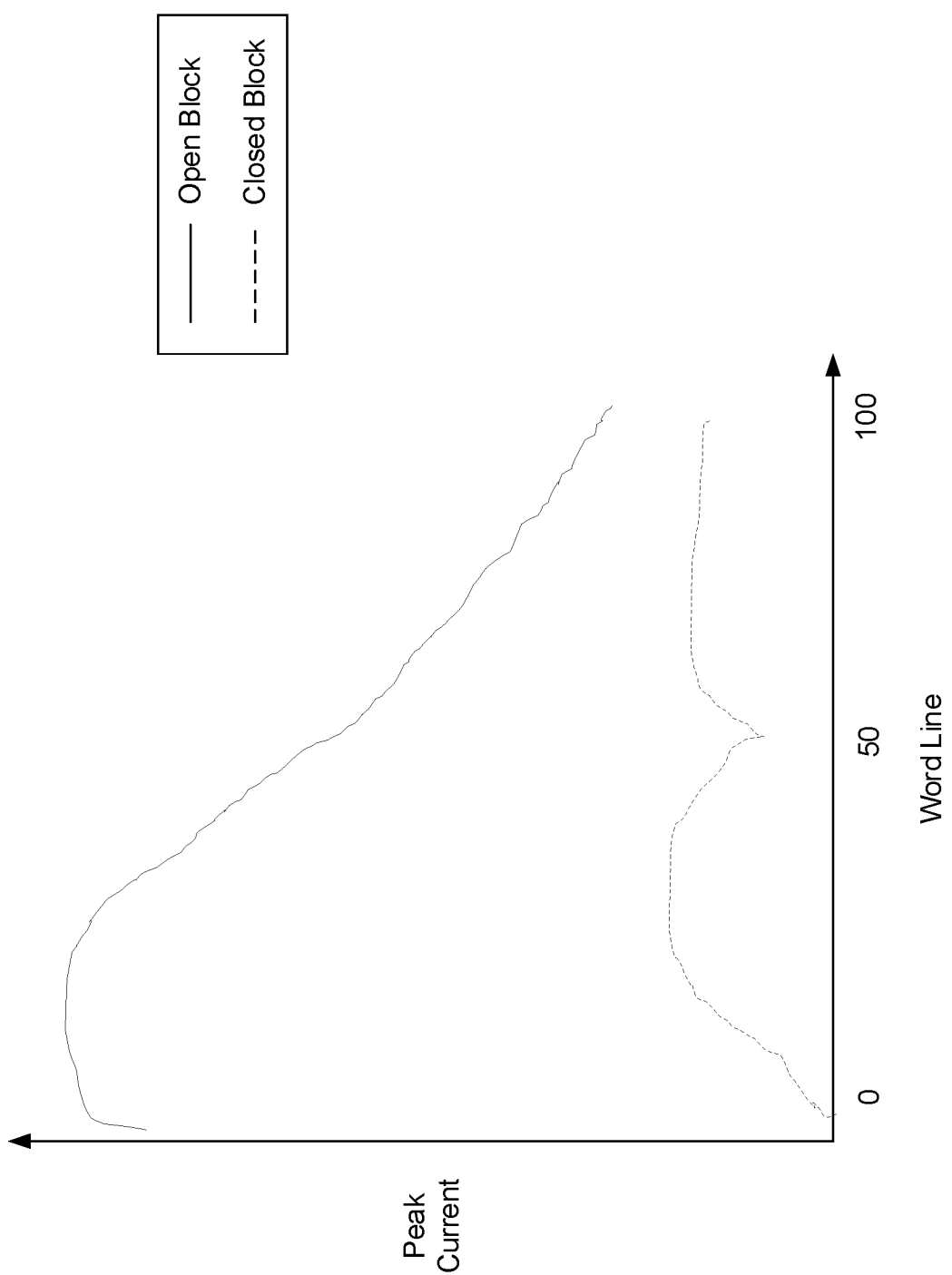
FIG. 9 is a graphical diagram illustrating an example of a relationship between peak current and word lines for reads performed on cells in open and closed blocks.
Figure 10:
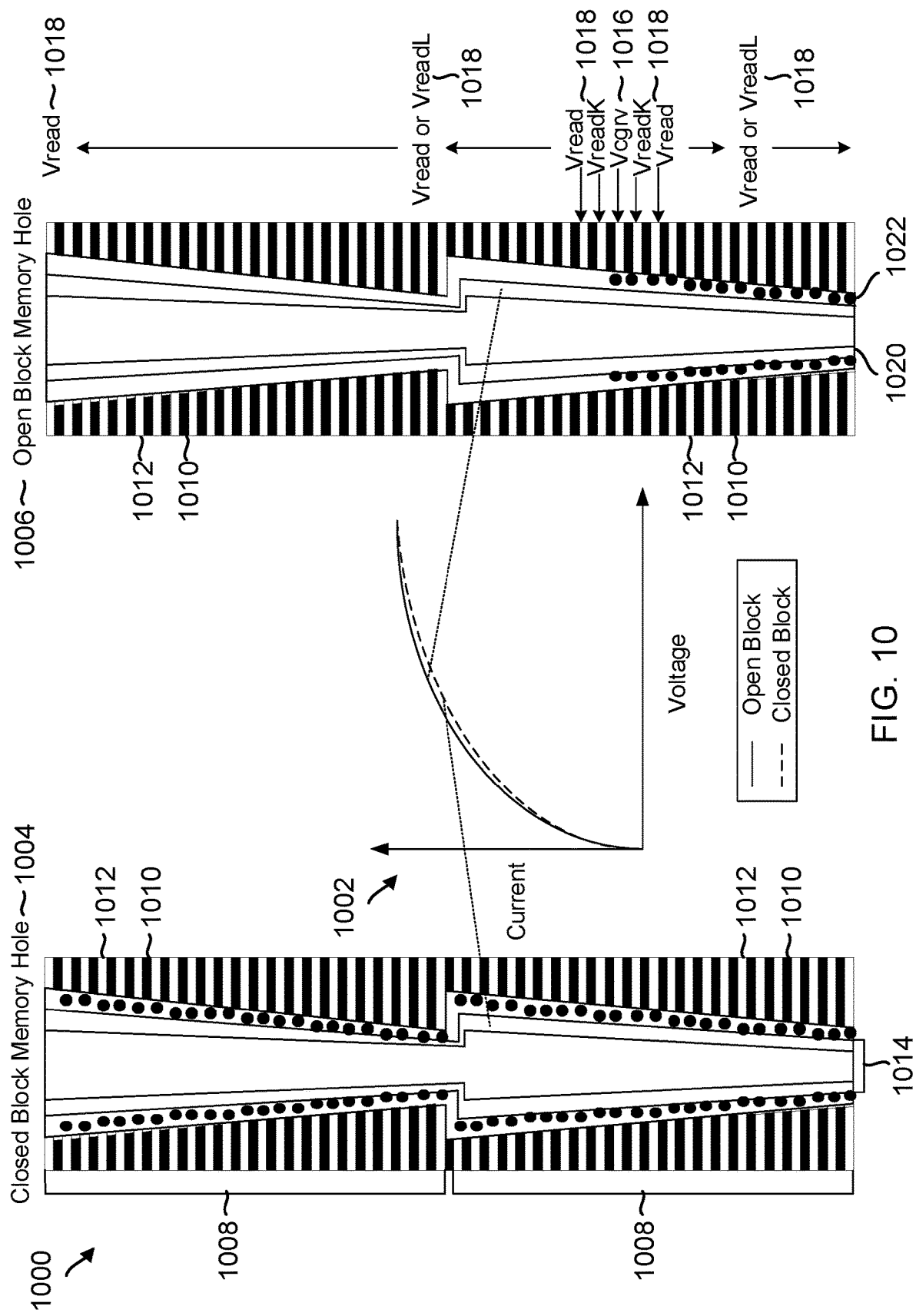
FIG. 10 is a conceptual diagram illustrating an example of a relationship between current and voltages for reads performed on cells in memory holes in an open and closed block.

FIG. 9 illustrates an example diagram 900 of a relationship between current and word lines for reads performed on cells in open and closed blocks. The current illustrated in diagram 900 represents the peak current 702, 806, 808 shown in FIGS. 7 and 8, which may vary depending on whether the word line is in an open or closed block and whether the word line is a lower or upper word line in an open block. The peak current may be significantly higher for open blocks than for closed blocks. While the peak current for closed blocks may decrease and then increase again at a center word line (e.g. the center of a multi-tier memory hole, such as illustrated in FIG. 10), the peak current for open blocks may constantly decrease from lower to upper word lines. For example, when the controller 123 programs cells of an open block at WL 24 (e.g. after cells of WLs 0-23 have already been programmed), the peak current along the bit line as a result of the read voltage applied at WL 24 may be significantly higher than when the controller 123 programs cells of the open block or another open block later at WL 70 (e.g. after cells of WLs 0-69 have already been programmed). The average current may similarly be higher for open blocks than for closed blocks, and for lower word lines than for upper word lines in open blocks.

FIG. 10 illustrates an example diagram 1000 showing a relationship chart 1002 between current and voltages for reads performed on cells in a closed block memory hole 1004 and an open block memory hole 1006. Each memory hole 1004, 1006 may include multiple tiers 1008 of oxides 1010 and word lines 1012 (e.g. word lines 304, 408) coupled to cells 1014 (e.g. cells 116, 302) within the memory holes. Thus, memory hole 1004 may correspond to one of the strings 314, 404 of FIGS. 3 and 4 for a closed block, and memory hole 1006 may correspond to another of the strings 314, 404 for an open block.

During a read, a control gate read voltage 1016 (Vcgrv) may be applied to the word line 1012 of a selected cell, and pass through read voltages 1018 (VreadK, Vread, and VreadL) may be applied to the word lines 1012 of unselected cells. For example, the voltage VreadK may be a high voltage applied to adjacent word lines to the word line of the selected cell, and the voltage Vread may be a high voltage (e.g. lower than VreadK) applied to the remaining word lines, and the voltage VreadL may be a read voltage (e.g. applied in lieu of Vread) to word lines lower than a predetermined word line of each memory hole tier 1008 when a parameter LAY_READ_EN is enabled. VreadL may be lower than Vread to compensate for the tapered shape of the memory hole 1004, 1006. Nevertheless, notwithstanding whether Vread or VreadL is used, the average and peak Icc (e.g. peak current 702, 806, 808) resulting from application of the read voltages 1016, 1018 may be larger in open block memory hole 1006 than in closed block memory hole 1004 for the same word line 1012. For instance, when Vread is applied to the word lines above the selected word line, the channel 1020 of the cells 1014 in the open block memory hole 1006 may experience stronger channel inversion than the channel of the cells in the closed block memory hole 1004, as less electrons (represented by the black dots) are programmed into the charge trapping layer 1022 of the open block cells. Accordingly, as illustrated in the relationship chart 1002, the current may be higher for open blocks than for closed blocks even if the same read voltage is being ramped up to Vread in both types of blocks.

To reduce the peak and average current for open blocks during a read (e.g. during a pre-read), the storage device described in the present disclosure allows the controller to cause the read voltage to be applied at different ramp rates or in different numbers of intermediate stages depending on whether the word line is in a closed block or an open block. The controller may also cause the read voltage to be applied in open blocks at different ramp rates or in different numbers of stages depending on whether the word line in the open block is a lower word line or an upper word line. Additionally, the controller may cause the read voltage to be applied to upper word lines in open blocks at different ramp rates, in different numbers of intermediate stages, or to different target voltages depending on whether the cells coupled to the upper word line are programmed or not programmed.

Figure 11:
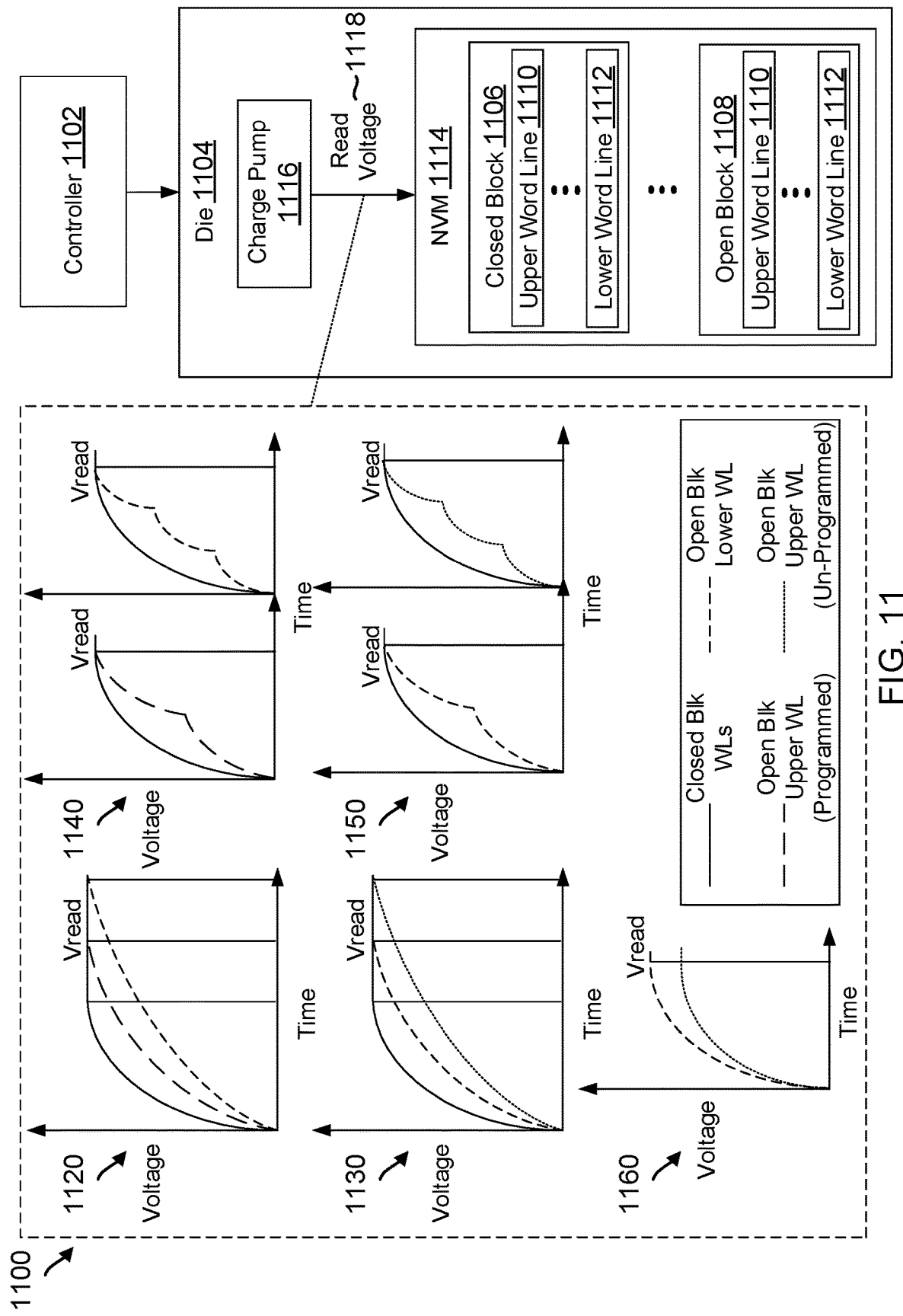
FIG. 11 is a conceptual diagram illustrating an example of a controller that reads data from a die including closed and open blocks according to different examples of read voltage ramp rate control in the storage device of FIG. 1.

FIG. 11 illustrates an example diagram 1100 of a controller 1102 in communication with a die 1104 over a bus. The die 1104 may include closed blocks 1106 and open blocks 1108, with each block including upper word lines 1110 and lower word lines 1112. The controller 1102 may correspond to controller 123 of FIG. 1, and the die 1104 may include a NVM 1114 corresponding to the NVM 110 of FIG. 1. The NVM 1114 may include the closed blocks 1106 and open blocks 1108, which may correspond to blocks 114, 402 of FIGS. 1 and 4. The upper word lines 1110 and lower word lines 1112 may correspond to word lines 304, 408, 1012 of FIGS. 3, 4, and 10.

The die 1104 may include a charge pump 1116 that ramps the read voltage applied to the word lines in response to a read command from the controller 1102. For example, when the controller sends a read command to the die 1104 that indicates a selected word line coupled to the cells to be read, a pre-read may be performed during which the die 1104 may charge a read voltage 1118 (e.g. the control gate read voltage 1016 or the pass through read voltage 1018 of FIG. 10) to Vread using the charge pump 1116 and apply the read voltage to the selected word line and unselected word lines (e.g. using a row decoder). When reading closed blocks 1106, the charge pump may ramp the voltage at a rapid rate as illustrated by the solid line arcs in diagrams 1120, 1130, 1140, 1150, and 1160, which may correspond to the ramping rate illustrated at time R2 in diagrams 604 and 606 of FIG. 6. For instance, the charge pump may increase the read voltage for closed blocks according to a default switching frequency that results in the ramping rate illustrated in diagrams 1120-1160.

In contrast, when reading open blocks 1108, the charge pump may ramp the voltage at a smaller rate as illustrated by the dashed line arcs in diagrams 1120, 1130, and 1160, or in a larger number of stages as illustrated by the dashed line arcs in diagrams 1140 and 1150. For instance, the charge pump may increase the read voltage for open blocks according to a smaller switching frequency than the default switching frequency to result in the reduced ramping rates illustrated in diagrams 1120, 1130 and 1160, or according to varying patterns of smaller and larger switching frequencies to result in the multi-stage ramping rates illustrated in diagrams 1140 and 1150. The different switching frequencies may be generated by the die 1104 or transmitted by the controller 1102 in response to a determination of the controller whether the block being read is a closed or open block. For instance, if the controller 1102 determines that the block being read is a closed block (e.g. by looking up a list of closed blocks stored in the NVM 1114), the controller may instruct the die 1104 to use the default switching frequency when charging the read voltage 1118, while if the controller determines that the block being read is an open block (e.g. by looking up a list of partially programmed blocks maintained in the volatile memory 118), the controller may instruct the die 1104 to use the smaller switching frequency or the pattern of smaller and larger switching frequencies when charging the read voltage 1118. In this way, the storage device may reduce the change in voltage over time, and thus reduce the peak and average current, for open blocks.

Moreover, when reading lower word lines 1112 of open blocks 1108, the charge pump may ramp the voltage at an even smaller rate as illustrated by the small dashed line arc in diagram 1120, or in a larger number of stages as illustrated by the small dashed line arc in diagram 1140, than when reading upper word lines 1110 of the open blocks. For instance, the charge pump may increase the read voltage for lower word lines 1112 according to a smaller switching frequency than for upper word lines to result in the further reduced ramping rate illustrated in diagram 1120, or according to a longer pattern of smaller and larger switching frequencies than for upper word lines to result in the larger number of stages illustrated in diagram 1140. The different switching frequencies may be generated by the die 1104 or transmitted by the controller 1102 in response to a determination of the controller whether the selected word line coupled to the cells being read is a lower word line or an upper word line. For instance, if the controller 1102 determines that the word line coupled to the cells being read is a lower word line (e.g. by identifying that the word line has a smaller address or is closer to the SGS than a predetermined word line), the controller may instruct the die 1104 to use a smaller switching frequency or a longer pattern of smaller/ larger frequencies when charging the read voltage 1118, while if the controller determines that the word line coupled to the cells being read is an upper word line (e.g. by identifying that the word line has a larger address or is closer to the SGD than the predetermined word line), the controller may instruct the die 1104 to use a larger switching frequency or a shorter pattern of smaller and larger switching frequencies when charging the read voltage 1118. In this way, the storage device may further reduce the higher peak and average current for lower word lines than for upper word lines.

Furthermore, when applying read voltages (i.e. pass through read voltages) to un-selected, upper word lines 1110 of open blocks 1108 that are not in a programmed state, the charge pump may ramp the voltage at an even smaller rate as illustrated by the very small dashed line arc in diagram 1130, or in a larger number of stages as illustrated by the very small dashed line arc in diagram 1150, than for lower word lines 1112 of the open blocks. For instance, the charge pump may increase the read voltage for un-programmed, upper word lines 1110 according to a smaller switching frequency than for lower word lines to result in the further reduced ramping rate illustrated in diagram 1130, or according to a longer pattern of smaller and larger switching frequencies than for lower word lines to result in the larger number of stages illustrated in diagram 1150. The different switching frequencies may be generated by the die 1104 or transmitted by the controller 1102 in response to a determination of the controller whether the upper word lines are in a programmed state or an un-programmed state. For instance, if the controller 1102 determines that the upper word lines are in an un-programmed state (e.g. by identifying that the cells coupled to those word lines are in the erase state 502 of FIG. 5), the controller may instruct the die 1104 to use a smaller switching frequency or a longer pattern of smaller/larger frequencies when charging the read voltage 1118, while if the controller determines the upper word lines are in a programmed state (e.g. by identifying that the cells coupled to those word lines are in one of the programmed states 504 of FIG. 5), the controller may instruct the die 1104 to use a larger switching frequency or a shorter pattern of smaller and larger switching frequencies when charging the read voltage 1118. In this way, the storage device may further reduce the higher peak and average current for un-programmed upper word lines, which may be higher than for programmed upper word lines due to stronger channel inversion for cells coupled to these un-programmed word lines.

Additionally, when applying read voltages (i.e. pass through read voltages) to un-selected, upper word lines 1110 of open blocks 1108 that are not in a programmed state, the charge pump may ramp the voltage to a smaller target voltage, as illustrated by the very small dashed line arc in diagram 1160, than for lower word lines 1112 of the open blocks. For instance, switching in the charge pump may cease earlier for un-programmed, upper word lines 1110 than for lower word lines to result in the smaller target voltage illustrated in diagram 1160. The different switching may be generated by the die 1104 or transmitted by the controller 1102 in response to a determination of the controller whether the upper word lines are in a programmed state or an un-programmed state. For instance, if the controller 1102 determines that the upper word lines are in an un-programmed state as described above, the controller may instruct the die 1104 to switch the charge pump for a shorter time when charging the read voltage 1118, while if the controller determines the upper word lines are in a programmed state as described above, the controller may instruct the die 1104 to switch the charge pump for a longer time when charging the read voltage 1118. In this way, the storage device may further reduce the higher peak and average current for un-programmed upper word lines by ramping to a smaller voltage than for lower word lines.

Thus, as described above, the controller 1102 may cause the read voltage 1118 to be applied to the word lines differently for closed blocks 1106 and open blocks 1108, as well as differently to the word lines in open blocks. In one example, the controller may cause the die 1104 to apply a uniformly smaller ramp rate of the read voltage for all word lines in an open block than for closed blocks. In another example, the controller may cause the die 1104 to apply a more relaxed (i.e. slower) ramp rate of the read voltage for programmed, lower word lines 1112 and a more aggressive (i.e. faster) ramp rate for programmed, upper word lines 1110. In a further example, the controller may cause the die to apply the read voltage to programmed, lower word lines 1112 in a larger number of stages than for programmed, upper word lines 1110. In another example, the controller may cause the die to apply a more relaxed ramp rate of the read voltage for un-programmed, upper word lines 1110 and a more aggressive ramp rate for programmed, lower word lines 1112. In a further example, the controller may cause the die to apply the read voltage to un-programmed, upper word lines 1110 in a larger number of stages than for programmed, lower word lines 1112. In an additional example, the controller may cause the die to charge the read voltage to a smaller target voltage for un-programmed, upper word lines 1110 than for programmed, lower word lines 1112. In yet another example, any of the examples previously described can be mixed or implemented in any combination.

Furthermore, the controller may identify whether a word line is a lower or upper word line depending on whether it respectively has a smaller or larger address, or is respectively closer to the SGS or the SGD, than a predetermined word line. The predetermined word line (i.e. the boundary word line between lower and upper word lines) may be determined based on the total number of word lines or the current (Icc) tolerance of the cells in different applications. For instance, if the total number of word lines in the multi-tier, open block memory hole 1006 is 96, the controller may determine the boundary word line to be half of the total number of word lines (i.e. 48). Thus, in this example where WL48 is the predetermined word line, WLs 0-47 may be lower word lines, and WLs 48-96 may be upper word lines. In other examples, different total numbers of word lines may result in different pre-determined, boundary word lines, and thus different lower and upper word lines. Moreover, if the current tolerance of cells is high (e.g. the storage device may function adequately even with some higher peak currents), less relaxed or faster ramping may be used, while if the current tolerance of cells is low (e.g. the storage device may not function adequately with higher peak currents), more relaxed or slower ramping may be used. For example, if the open block memory hole 1006 has high Icc tolerance, the pre-determined, boundary word line may be lower (resulting in a smaller number of lower word lines and thus less relaxed ramp rates being used overall), while if the open block memory hole has low Icc tolerance, the pre-determined boundary word line may be higher (resulting in a larger number of lower word lines and thus more relaxed ramp rates being used overall).

Figures 12A, 12B:
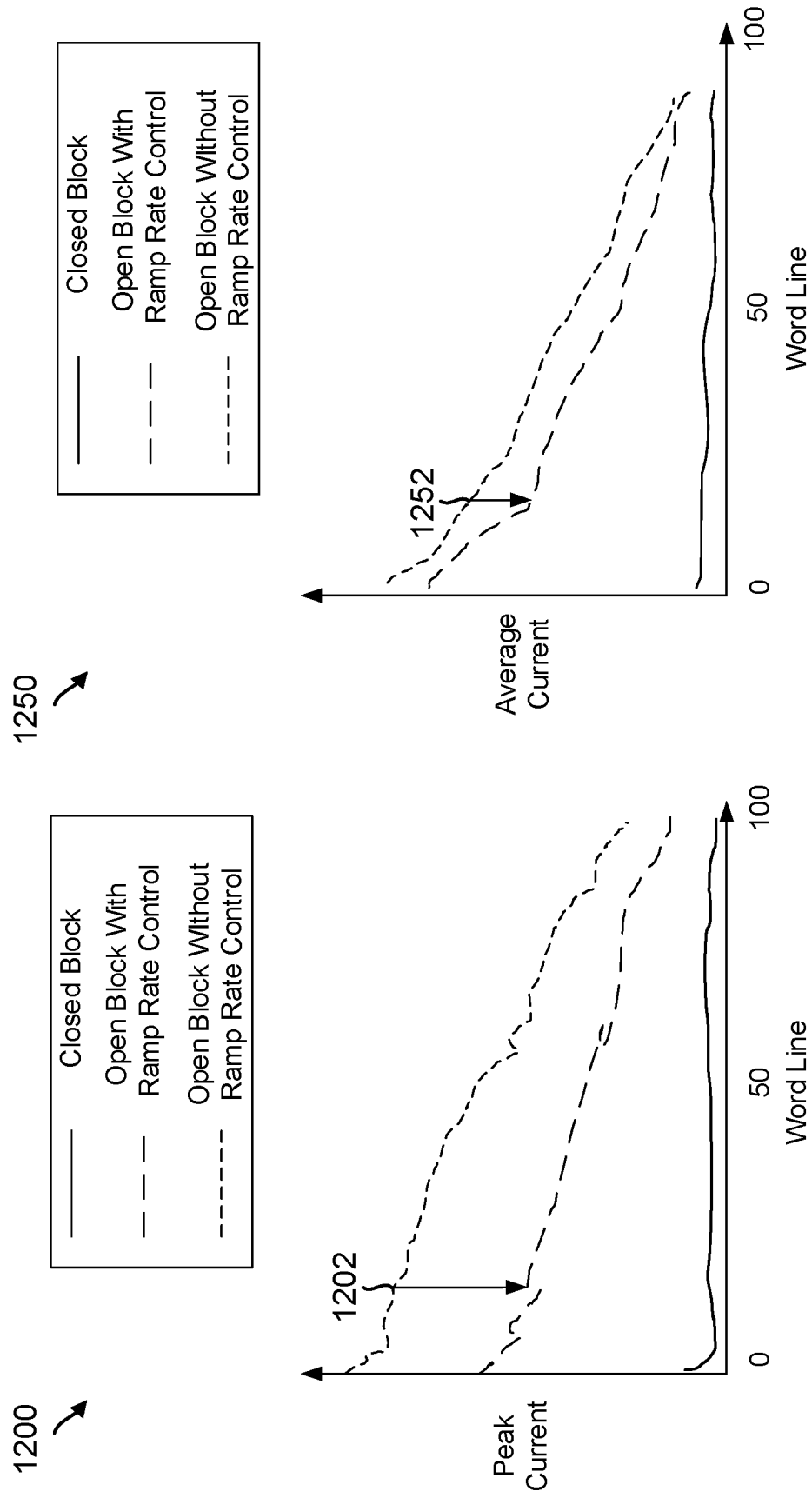
FIGS. 12A and 12B are graphical diagrams illustrating an example difference in relationship between word lines and peak and average current for reads performed on cells in open and closed blocks with and without ramp rate control.

FIGS. 12A and 12B illustrate example diagrams 1200, 1250 of peak and average currents, respectively, for reads performed on cells on different word lines in open and closed blocks with and without ramp rate control. For instance, referring to FIG. 12A, the peak current (e.g. peak current 702, 806, 808) generally found in open blocks in response to applied read voltages may be reduced by an amount 1202 (e.g. 6.4-6.6% or 4-5 mA for lower word lines) as a result of the ramp rate control described above with respect to FIG. 11. Moreover, referring to FIG. 12B, the average current generally found in open blocks in response to applied read voltages may be reduced by an amount 1252 (e.g. 2.3-5.2% or ~1 mA for lower word lines) as a result of the ramp rate control described above. The peak and average current may be similarly reduced as a result of the multi-stage voltage control described above.

Figure 13:
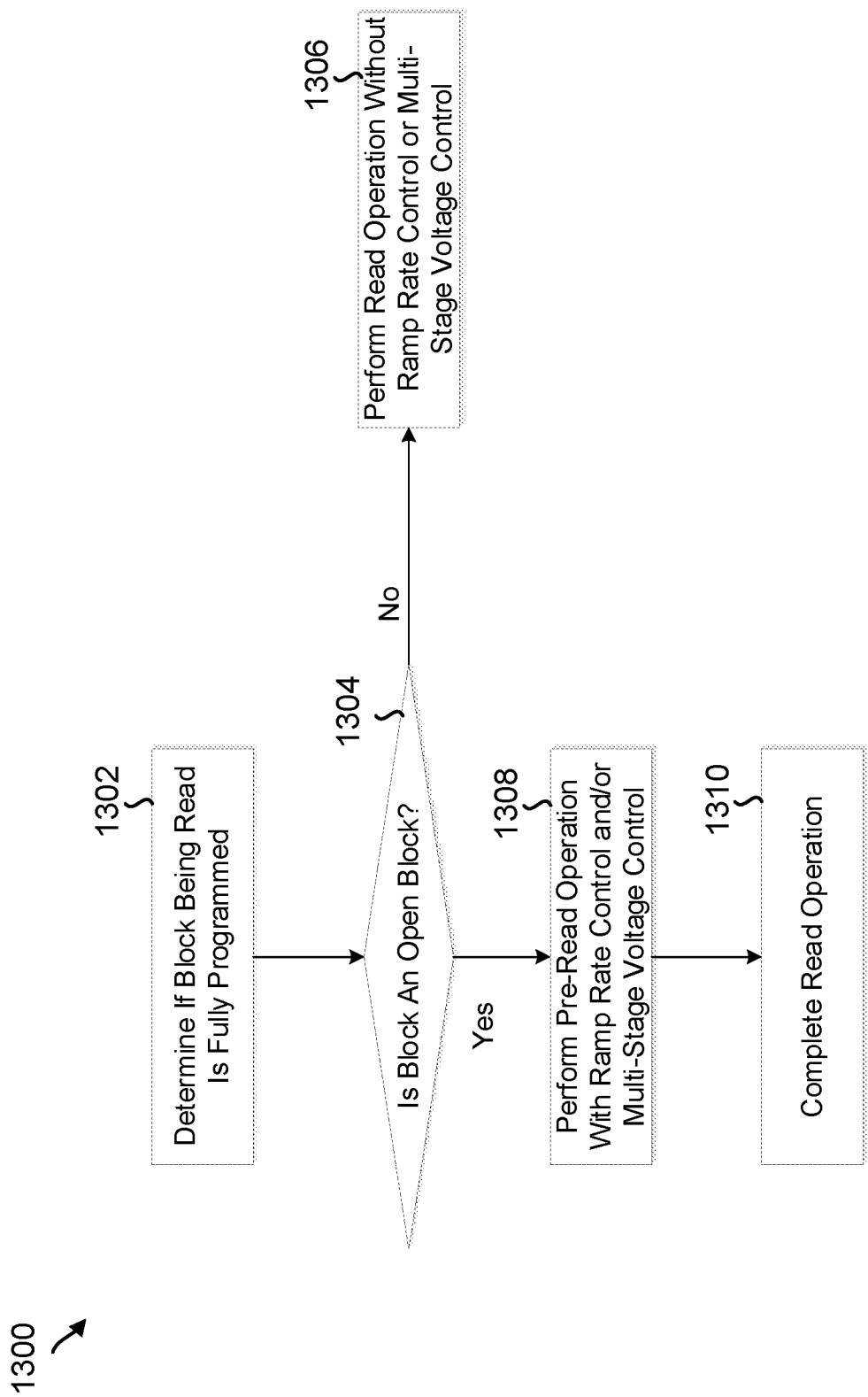
FIG. 13 is a flow chart illustrating a method for reducing peak and average current in open blocks during reads using ramp rate and multi-stage voltage control as performed by the storage device of FIG. 1.

FIG. 13 illustrates an example flow chart 1300 of a method for reducing peak and average current in open blocks during reads using ramp rate control and multi-stage voltage control. For example, the method can be carried out in a storage device 102 such as the one illustrated in FIG. 1. Each of the steps in the flow chart can be controlled using the controller as described below (e.g. controller 123, 1102), or by some other suitable means.

As represented by block 1302, the controller may determine if a block being read is fully programmed. For example, referring to FIGS. 4 and 11, after the controller 1102 receives a read command from the host device (e.g. host device 104) including a logical address associated with a block 402 to be read, the controller 1102 may determine whether the block 402 being read is an open block 1108 or a closed block 1106. For instance, the controller may read one or more look-up tables stored in the NVM 1114 or volatile memory 118 of fully programmed and partially programmed blocks to determine whether the block 402 to be read is an open block (i.e. not fully programmed).

As represented by block 1304, if the controller determines the block is not an open block, then as represented by block 1306, the controller may perform a read operation without ramp rate control or multi-stage voltage control. For example, referring to FIGS. 3, 4, 6, 10, and 11, if the controller 1102 determines that the block 402 is a closed block 1106, then during the pre-read (e.g. at time R2 in FIG. 6), the controller may cause a read voltage 1118 (e.g. a control gate read voltage 1016 or a pass through read voltage 1018) to be applied to a first one of the word lines 304, 408, 1012 (e.g. a selected or un-selected word line) of the closed block 1106 at a first ramp rate (e.g. as illustrated by the solid line arc in diagrams 1120-1160 of FIG. 11 and similarly at time R2 in FIG. 6) in response to the determination.

Otherwise, if the controller determines at block 1306 that the block is an open block, then as represented by block 1308, the controller may perform a pre-read operation with ramp rate control. In one example of ramp rate control, referring to FIGS. 3, 4, 6, 10, and 11, if the controller 1102 determines that the block 402 is an open block 1108, then during the pre-read (e.g. at time R2 in FIG. 6), the controller may cause a read voltage 1118 (e.g. a control gate read voltage 1016 or a pass through read voltage 1018) to be applied to a second one of the word lines 304, 408, 1012 (e.g. a selected or un-selected word line) of the open block 1108 at a second ramp rate slower than the first ramp rate (e.g. as illustrated by the dashed line arcs in diagrams 1120 and 1130 of FIG. 11) in response to the determination.

In another example of ramp rate control, the second one of the word lines 304, 408, 1012 may be a lower word line 1112, and the controller may cause a read voltage 1118 (e.g. a control gate read voltage 1016 or a pass through read voltage 1018) to be applied to a third one of the word lines 304, 408, 1012 (e.g. an upper word line 1110) at a third ramp rate faster than the second ramp rate when one of the cells 302 coupled to the upper word line 1110 is in a programmed state (e.g. as illustrated by the dashed line arcs in diagram 1120 of FIG. 11). For instance, as illustrated in diagram 1120, the upper word line 1110 may ramp to Vread faster than the lower word line 1112 in the open block 1108 when the upper word line is in a programmed state (e.g. in one of the program states 504 of FIG. 5).

In a further example of ramp rate control, the second one of the word lines 304, 408, 1012 may be a lower word line 1112, and the controller may cause a read voltage 1118 (e.g. a control gate read voltage 1016 or a pass through read voltage 1018) to be applied to a third one of the word lines 304, 408, 1012 (e.g. an upper word line 1110) at a third ramp rate slower than the second ramp rate when one of the cells 302 coupled to the upper word line 1110 is not in a programmed state (e.g. as illustrated by the dashed line arcs in diagram 1130 of FIG. 11). For instance, as illustrated in diagram 1130, the upper word line 1110 may ramp to Vread slower than the lower word line 1112 in the open block 1108 when the upper word line is in an un-programmed state (e.g. in the erase state 502 of FIG. 5).

Moreover, if the controller determines at block 1306 that the block is an open block, then at block 1308 the controller may perform a pre-read operation with multi-stage voltage control (additionally or alternatively to ramp rate control). In one example of multi-stage voltage control, referring to FIGS. 3, 4, 6, 10, and 11, if the controller 1102 determines that the block 402 is an open block 1108, then during the pre-read (e.g. at time R2 in FIG. 6), the controller may cause a read voltage 1118 (e.g. a control gate read voltage 1016 or a pass through read voltage 1018) to be applied to a second one of the word lines 304, 408, 1012 (e.g. a selected or un-selected word line) of the open block 1108 in a number of stages (e.g. as illustrated by the dashed line arcs in diagrams 1140 and 1150 of FIG. 11) in response to the determination.

In another example of multi-stage voltage control, the second one of the word lines 304, 408, 1012 may be a lower word line 1112, and the controller may cause a read voltage 1118 (e.g. a control gate read voltage 1016 or a pass through read voltage 1018) to be applied to a third one of the word lines 304, 408, 1012 (e.g. an upper word line 1110) in a second number of stages smaller than the number of stages (for the lower word line) when one of the cells 302 coupled to the upper word line 1110 is in a programmed state (e.g. as illustrated by the dashed line arcs in diagram 1140 of FIG. 11). For instance, as illustrated in diagram 1140, the upper word line 1110 may ramp to Vread in less stages (e.g. 2 stages) than that of the lower word line 1112 (e.g. 3 stages) in the open block 1108 when the upper word line is in a programmed state (e.g. in one of the program states 504 of FIG. 5).

In a further example of multi-stage voltage control, the second one of the word lines 304, 408, 1012 may be a lower word line 1112, and the controller may cause a read voltage 1118 (e.g. a control gate read voltage 1016 or a pass through read voltage 1018) to be applied to a third one of the word lines 304, 408, 1012 (e.g. an upper word line 1110) in a second number of stages larger than the number of stages (for the lower word line) when one of the cells 302 coupled to the upper word line 1110 is not in a programmed state (e.g. as illustrated by the dashed line arcs in diagram 1150 of FIG. 11). For instance, as illustrated in diagram 1150, the upper word line 1110 may ramp to Vread in more stages (e.g. 3 stages) than that of the lower word line 1112 (e.g. 2 stages) in the open block 1108 when the upper word line is in an un-programmed state (e.g. in the erase state 502 of FIG. 5).

In an additional example of ramp rate control and multi-stage voltage control, the second one of the word lines 304, 408, 1012 may be a lower word line 1112, and the controller may cause a read voltage 1118 (e.g. a control gate read voltage 1016 or a pass through read voltage 1018) applied to the lower word line 1112 to charge to a first target voltage (e.g. Vread as illustrated in diagrams 604, 606 in FIG. 6), and to cause a read voltage 1118 (e.g. a control gate read voltage 1016 or a pass through read voltage 1018) applied to a third one of the word lines 304, 408, 1012 (e.g. an upper word line 1110) to charge to a second target voltage less than the first target voltage (e.g. a voltage less than Vread, such as Vdd) when one of the cells 302 coupled to the upper word line 1110 is not in a programmed state (e.g. as illustrated by the dashed line arcs in diagram 1160 of FIG. 11). For instance, as illustrated in diagram 1160, the upper word line 1110 may ramp to a smaller voltage than Vread as opposed to the lower word line 1112 in the open block 1108 when the upper word line is in an un-programmed state (e.g. in the erase state 502 of FIG. 5).

The controller 1102 may cause the read voltage 1118 to be applied to the second one of the word lines (e.g. the lower word line 1112) and may cause the read voltage 1118 to be applied to the third one of the word lines (e.g. the upper word line 1110) based on a total number of word lines 304, 408, 1012 in the block 402 or a current tolerance (e.g. a tolerance of peak or average Icc) of the cells 302 in the block 402. For example, the controller may determine whether one of the word lines 304, 408, 1012 is a lower word line 1112 or an upper word line 1110 based on the total number of word lines in the memory hole 1004, 1006 as described above or based on the current tolerance as described above. Based on whether the word line is determined to be a lower or upper word line, the controller may determine whether to cause the read voltage to be applied using slower or faster ramp rates or using less or more voltage stages as described above.

The block 402 may include a string 314, 404 of cells 302 coupled to the word lines 304, 408, 1012. In one example, the third one of the word lines coupled to the string may be associated with a larger address than the second one of the word lines coupled to the string. For instance, the third one of the word lines may be an upper word line 1110 that is closer to the SGD 310, 412 than the second one of the word lines (e.g. a lower word line 1112). In such example, the upper word line may be programmed after the lower word line according to NOP. In another example, the third one of the word lines coupled to the string may be associated with a smaller address than the second one of the word lines coupled to the string. For instance, the third one of the word lines may be an upper word line 1110 that is closer to the SGS 308, 410 than the second one of the word lines (e.g. a lower word line 1112). In such example, the upper word line may be programmed after the lower word line according to ROP.

Finally, as represented by block 1310, the controller may complete the read operation for the block. For example, referring to FIGS. 1, 3, 4, 6, 10, and 11, after the controller 123, 1102 ramps the read voltage 1118 (e.g. a control gate read voltage 1016 or a pass through read voltage 1018) to Vread during the pre-read at time R2 using ramp rate control and/or multi-stage voltage control as described above, the controller may discharge the read voltage applied to the selected cell (e.g. at time R3), charge the read voltage applied to the selected cell to Vcgrv (e.g. at time R4) without the ramp rate control or multi-stage voltage control described above, and proceed to read the data from the cells 302 into the data latches 126 using the sense amplifiers 124. After obtaining the data from the NVM 110, 1114, the controller may transmit the read data back to the host device 104.

Accordingly, the storage device described in the present disclosure allows for reduction of peak and average current resulting from applied read voltages to word lines of open blocks during pre-reads. Peak and average current reduction may be achieved by charging the read voltage during the pre-read at a slower ramp rate, or alternatively or additionally in a greater number of voltage stages, for open blocks than for closed blocks, for lower word lines than for programmed upper word lines in open blocks, and for un-programmed upper word lines than for lower word lines in open blocks. Current reduction may also be achieved by charging the read voltage to a smaller target voltage for un-programmed upper word lines than for lower word lines in open blocks. As a result, power consumption may be balanced with read performance.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
a memory comprising a block including a plurality of word lines; and
a controller configured to determine whether the block is open or closed, to cause a read voltage to be applied to a first one of the word lines of the block in response to determining the block is closed, and to cause a read voltage to be applied to a second one of the word lines of the block in a number of stages in response to determining the block is open.

2. The storage device of claim 1, wherein the block includes a string of cells coupled to the plurality of word lines.

3. The storage device of claim 2, wherein a third one of the word lines coupled to the string is associated with a larger address than the second one of the word lines coupled to the string.

4. The storage device of claim 2, wherein a third one of the word lines coupled to the string is associated with a smaller address than the second one of the word lines coupled to the string.

5. The storage device of claim 1, wherein the block includes cells coupled to the plurality of word lines, and wherein the controller is further configured to cause a read voltage to be applied to a third one of the word lines of the block in a second number of stages smaller than the number of stages when one of the cells coupled to the third one of the word lines is in a programmed state.

6. The storage device of claim 1, wherein the block includes cells coupled to the plurality of word lines, and wherein the controller is further configured to cause a read voltage to be applied to a third one of the word lines of the block in a second number of stages larger than the number of stages when one of the cells coupled to the third one of the word lines is not in a programmed state.

7. The storage device of claim 1, wherein the block includes cells coupled to the plurality of word lines, and wherein, in response to determining the block is open, the controller is further configured to cause the read voltage applied to the second one of the word lines to charge to a first target voltage, and to cause a read voltage applied to a third one of the word lines of the block to charge to a second target voltage less than the first target voltage when one of the cells coupled to the third one of the word lines is not in a programmed state.

8. The storage device of claim 1, wherein the controller is further configured to cause the read voltage to be applied to the second one of the word lines at a slower ramp rate than the read voltage applied to the first one of the word lines in response to determining the block is open.

9. The storage device of claim 1, wherein the block includes cells coupled to the plurality of word lines, and wherein, in response to determining the block is open, the controller is further configured to cause the read voltage to be applied to the second one of the word lines and to cause a read voltage to be applied to a third one of the word lines of the block based on a total number of word lines in the block or a current tolerance of the cells in the block.

10. A storage device, comprising:
- a memory comprising a block including a plurality of word lines; and
- a controller configured to determine whether the block is open, to cause a read voltage to be applied to a first one of the word lines of the block in a first number of stages in response to determining the block is open, and to cause a read voltage to be applied to a second one of the word lines of the block in a second number of stages different than the first number of stages.

11. The storage device of claim 10, wherein the block includes cells coupled to the plurality of word lines, and wherein the second number of stages is smaller than the first number of stages when one of the cells coupled to the second one of the word lines is in a programmed state.

12. The storage device of claim 10, wherein the block includes cells coupled to the plurality of word lines, and wherein the second number of stages is larger than the first number of stages when one of the cells coupled to the second one of the word lines is not in a programmed state.

13. The storage device of claim 10, wherein the block includes cells coupled to the plurality of word lines, and wherein, in response to determining the block is open, the controller is further configured to cause the read voltage applied to the first one of the word lines to charge to a first target voltage, and to cause the read voltage applied to the second one of the word lines to charge to a second target voltage less than the first target voltage when one of the cells coupled to the second one of the word lines is not in a programmed state.

14. The storage device of claim 10, wherein the controller is further configured to cause the read voltage to be applied to the second one of the word lines at a slower ramp rate than the read voltage applied to the first one of the word lines in response to determining the block is open.

15. The storage device of claim 10, wherein the block includes cells coupled to the plurality of word lines, and wherein, in response to determining the block is open, the controller is further configured to cause the read voltage to be applied to the first one of the word lines and to cause the read voltage to be applied to the second one of the word lines based on a total number of word lines in the block or a current tolerance of the cells in the block.

16. A storage device, comprising:
- a memory comprising a first block and a second block each including a plurality of word lines; and
- a controller configured to determine whether the first block is open or closed, and to cause a read voltage to be applied to a first one of the word lines of the first block in response to determining the first block is closed;
- wherein the controller is further configured to determine whether the second block is open or closed, to cause a read voltage to be applied to a second one of the word lines of the second block in a first number of stages in response to determining the second block is open, and to cause a read voltage to be applied to a third one of the word lines of the second block in a second number of stages different than the first number of stages.

17. The storage device of claim 16, wherein the second block includes cells coupled to the plurality of word lines, and wherein the second number of stages is smaller than the first number of stages when one of the cells coupled to the third one of the word lines is in a programmed state.

18. The storage device of claim 16, wherein the second block includes cells coupled to the plurality of word lines, and wherein the second number of stages is larger than the first number of stages when one of the cells coupled to the third one of the word lines is not in a programmed state.

19. The storage device of claim 16, wherein the controller is further configured to cause the read voltage to be applied to the second one of the word lines at a slower ramp rate than the read voltage applied to the first one of the word lines in response to determining the second block is open.

20. The storage device of claim 16, wherein the second block includes cells coupled to the plurality of word lines, and wherein, in response to determining the second block is open, the controller is further configured to cause the read voltage applied to the second one of the word lines to charge to a first target voltage, and to cause the read voltage applied to the third one of the word lines to charge to a second target voltage less than the first target voltage when one of the cells coupled to the third one of the word lines is not in a programmed state.

\* \* \* \* \*